United States Patent [19]

Watanabe et al.

[11] Patent Number: 5,268,949
[45] Date of Patent: Dec. 7, 1993

[54] CIRCUIT FOR GENERATING M-SEQUENCE PSEUDO-RANDOM PATTERN

[75] Inventors: Hirobumi Watanabe; Hiroshi Nagai, both of Tokyo, Japan

[73] Assignee: Ando Electric Co., Ltd., Tokyo, Japan

[21] Appl. No.: 938,572

[22] Filed: Aug. 31, 1992

Related U.S. Application Data

[63] Continuation-in-part of Ser. No. 676,046, Mar. 17, 1991, abandoned.

[30] Foreign Application Priority Data

Mar. 28, 1990 [JP]  Japan ................................ 2-80226

[51] Int. Cl.⁵ .......................... G06F 1/02; H03K 3/84; G11C 19/00
[52] U.S. Cl. .......................................... 377/33; 377/67; 377/72; 331/78; 364/717
[58] Field of Search ...................... 377/33, 34, 72, 67; 331/78; 364/717

[56] References Cited

U.S. PATENT DOCUMENTS

| | | | |
|---|---|---|---|
| 3,700,806 | 10/1972 | Vasseur | 331/78 |
| 3,761,696 | 9/1973 | Russell | 331/78 |
| 4,325,129 | 4/1982 | Groth | 364/717 |
| 4,776,012 | 10/1988 | Zscheile et al. | 364/717 |
| 4,875,021 | 10/1989 | Sonetaka | 331/78 |

Primary Examiner—John S. Heyman
Attorney, Agent, or Firm—Seidel, Gonda, Lavorgna & Monaco

[57] ABSTRACT

The present invention provides a MRP generator comprising m MRP generating circuits connected in parallel which are operated at a 1/m clock speed and have a predetermined time relation to each other, wherein the MRP generating circuits are operated on the multiplex basis. The operating speed is improved.

2 Claims, 5 Drawing Sheets

```
  0           10          20          30          40
1111111000  0001000001  1000010100  0111100100  0101100111
└────┘                              └────┘
INITIAL VALUE 1                     INITIAL VALUE 2

32 PATTERNS
└──────────────────────────┘

50          60          70          80          90
0101001111  1010000111  0001001001  1011010110  1111011000
                 └────┘                              └─
                 INITIAL VALUE 3                    INITIAL VALUE 4

32 PATTERNS                   32 PATTERNS
└────────────────────┘       └────────────────────┘

100         110         120           [PATTERN NO.]
1101001011  1011100110  0101010          [7-STEP M SERIES PATTERN]
─┘
```

CIRCUIT FOR GENERATING M-SEQUENCE PSEUDO-RANDOM PATTERN

This is a continuation-in-part of co-pending application Ser. No. 07/676,046 filed on Mar. 17, 1991, now abandoned.

BACKGROUND OF THE INVENTION

1. Field of the Invention

The present invention relates to a circuit for generating a M-sequence (Maximum-length linear shift register sequence) pseudo-random pattern which are multiplexed in m fold. This pattern will be herein called "MRP".

2. Prior Art

The conventional MRP generator will be briefly explained in reference to FIG. 4.

In FIG. 4, the MRP generator includes a n-step shift register 1 and an exclusive logical sum gate (hereinafter called "EXOR gate") 2. 3 is an output and 10 is clock signal.

The MRP generator shown in FIG. 4 is a feedback circuit in which the n-step shift register 1 has a feedback loop by way of the EXOR gate 2. In order to generate a MRP with a high speed, the n-step shift register is actuated by a fast clock signal 10.

The highest operating speed of the MRP generator in FIG. 4 is determined by the performances of the respective elements comprising the MRP generator and thus it is not possible to attain a higher operating speed.

Accordingly, a principal object of the present invention is to provide a MRP generator having a higher operating speed than the conventional MRP generator.

BRIEF SUMMARY OF THE INVENTION

The present invention provides a MRP generator comprising m MRP generating circuits connected in parallel which are operated at a 1/m clock speed and have a predetermined time relation to each other, wherein the MRP generating circuits are operated on the multiplex basis.

DETAILED EXPLANATION OF THE INVENTION

According to the present invention, the MRP generator comprises m MRP pattern generating circuits, each comprising a shift register and an EXOR gate and the m MRP pattern generating circuits being connected in parallel. Assuming that the pattern cycle of each of the MRP generating circuits is 360 degrees, the time relation between the signals of the MRP generating circuits are set at $\Delta\theta 360/m$ and initial values set in the MRP generating circuits are sequentially distanced of shifted by $\Delta\theta = 360/m$ from one register to the next.

A preferred embodiment of the MRP generator according to the present invention will be described in detail in reference to FIG. 1. In this figure, the MRP generator comprises n-step shift registers 11, 21, 31 and 41, EXOR gates 12, 22, 32 and 42 and set circuits 13, 23, 33. The numerals 14, 24, 34 and 44 indicate set signals and 15, 25, 35 and 45 indicate outputs.

Figures 3, 4:
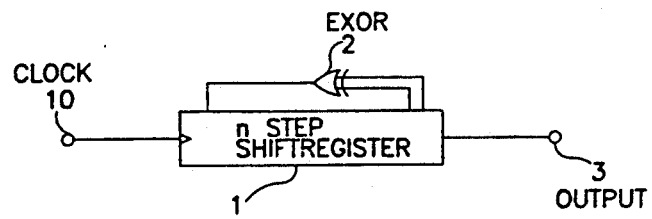
FIG. 3 is a diagram showing the setting of the internal states of the shift registers for m=4.
FIG. 4 shows the conventional MRP generator.

A first MRP generating circuit is composed of the circuit elements 11, 12 and 13, a second MRP generating circuit is composed of the circuit elements 21,22 and 23, a third MRP generation circuit is composed of the circuit elements 31,32 and 33, and a forth MRP generation circuit is composed of the circuit elements 41, 42 and 43, respectively. In FIG. 4, the four MRP generating circuits are connected in parallel. The shift registers 11, 21, 31 and 41 are operated by a clock signal 10.

The time relation between the signals of the first, second, third and forth MRP circuits are so set that, assuming that the pattern cycle of each of the MRP generating circuits is 360 degrees, the time relation between the signals of the MRP generating circuits are set at $\Delta\theta = 360/4$ and initial values of the sub-circuits are sequentially distanced by this $\Delta\theta$ from one to the next. The shift registers 11, 21, 31 and 41 are set at the initial values by set signals from the set circuits 12, 21, 31 and 41, respectively, so as to establish this time relationship.

With this arrangement, the outputs 15, 25, 35 and 45 have MRPs having a time relation between them by sequentially distanced $\Delta\theta$.

In general, m MRP generating circuits are connected in parallel and, assuming the pattern cycle of each of the MRP generating circuits being 360 degrees, the time relation between the signals of the MRP generating circuits are set at $\Delta\theta = 360/m$ and initial inputs to the circuits are sequentially distanced by $\Delta\theta$ from one to the next.

Figure 1:
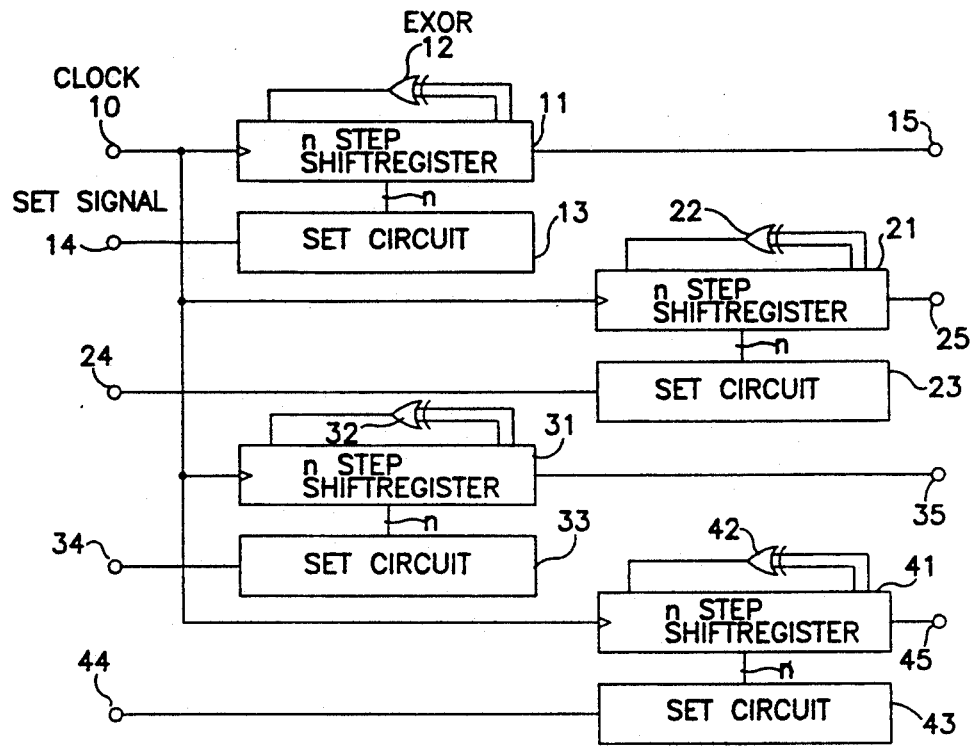
FIG. 1 is a block diagram of a MRP generator according to the present invention.
Figure 2:
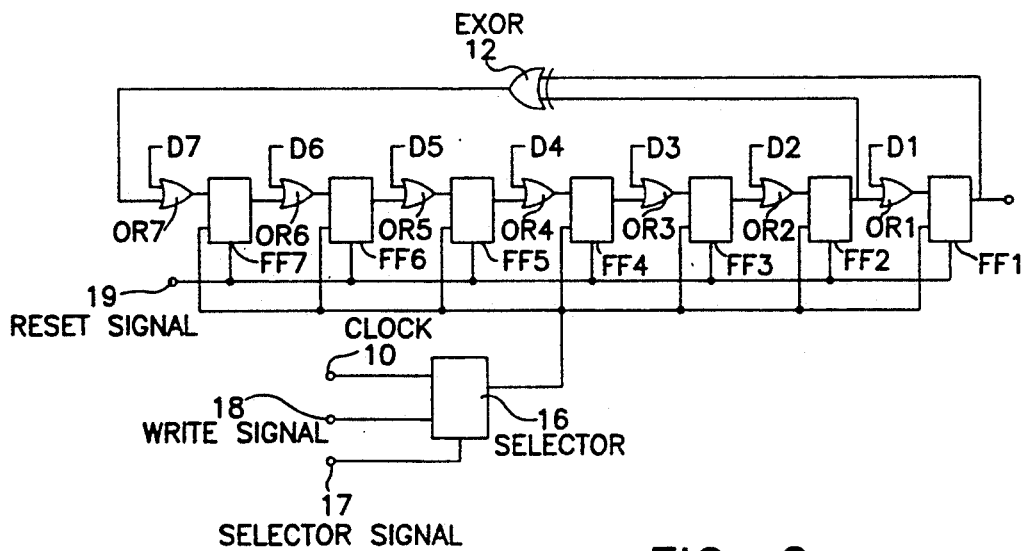
FIG. 2 shows an embodiment of the first MRP generating circuit of the MRP generator shown in FIG. 1.

FIG. 2 illustrates an embodiment of the first MRP generating circuit in FIG. 1, which is, in this example, a seven step circuit and the length of the pattern is $2^7 - 1$.

The circuit in FIG. 2 is composed of OR gates OR-1-OR7, flip-flops FF1-FF7, an EXOR gate 12 and a selector 16. D1-D7 are input data. The selector 16 is adapted to select either one of a clock signal 10 or a write signal 18 and relay the selected signal to the clock input of the FF1-FF7.

In order to set the initial values, a reset signal 19 is supplied to the reset terminals of the FF1-FF7 so as to clear the output of them and one sides of the input terminals of the OR gates are made "L".

Next, the initial values are sent to the D1-D7 terminal to set the FF1-FF7 by a write signal 18 selected by the selector signal 17.

In pattern generation operation, the D1-D7 terminals is made "L" and the selector 17 selects the clock signal 10 by the select signal 17. By so doing, the circuit will operate as a register 11 to generate a seven step MRP.

If m circuits shown in FIG. 2 are used, m seven-step MRPs can be generated in parallel at the outputs.

In this case, if the initial values set in the respective MRP generating circuits are data sequentially distanced by $\Delta\theta = 360/m$ from one to the next, the m outputs data become MRPs for m-fold multiplexing having sequentially shifted by a m period.

Next, an example of setting of the initial values in a seven-step MRP generating circuit when m=4 will be described in making reference to FIG. 3.

With m being 4, $\Delta\theta=360/4=90$ degrees. Expressing this by pattern bits, $\Delta P=2^7/4=32$ and data having sequentially distanced by 32 pattern bits are outputted. To achieve this, the internal states of the shift registers are so set that the outputs are sequentially shifted from one to the next by 32 pattern bits.

To clarify the setting of the internal states of the shift registers, reference is made to FIG. 3.

The upper row of FIG. 3 indicates the pattern numbers and the number 10 to 120 are assigned in this example.

The lower row of FIG. 3 indicates seven-step MRPs and initial values 1 to 4 are illustrated in this figure.

There are 32 pattern bits from the initial value 1 to the initial value 2 and the other initial values are similarly shifted by 32 patterns.

Since the MRP generating circuits include shift registers, the internal states can be derived from the M-series. If the initial value 1 is selected as shown in FIG. 3, each of the initial values 2–4 consists of seven pattern bits by 32 pattern bits apart from each other.

Figure 5:
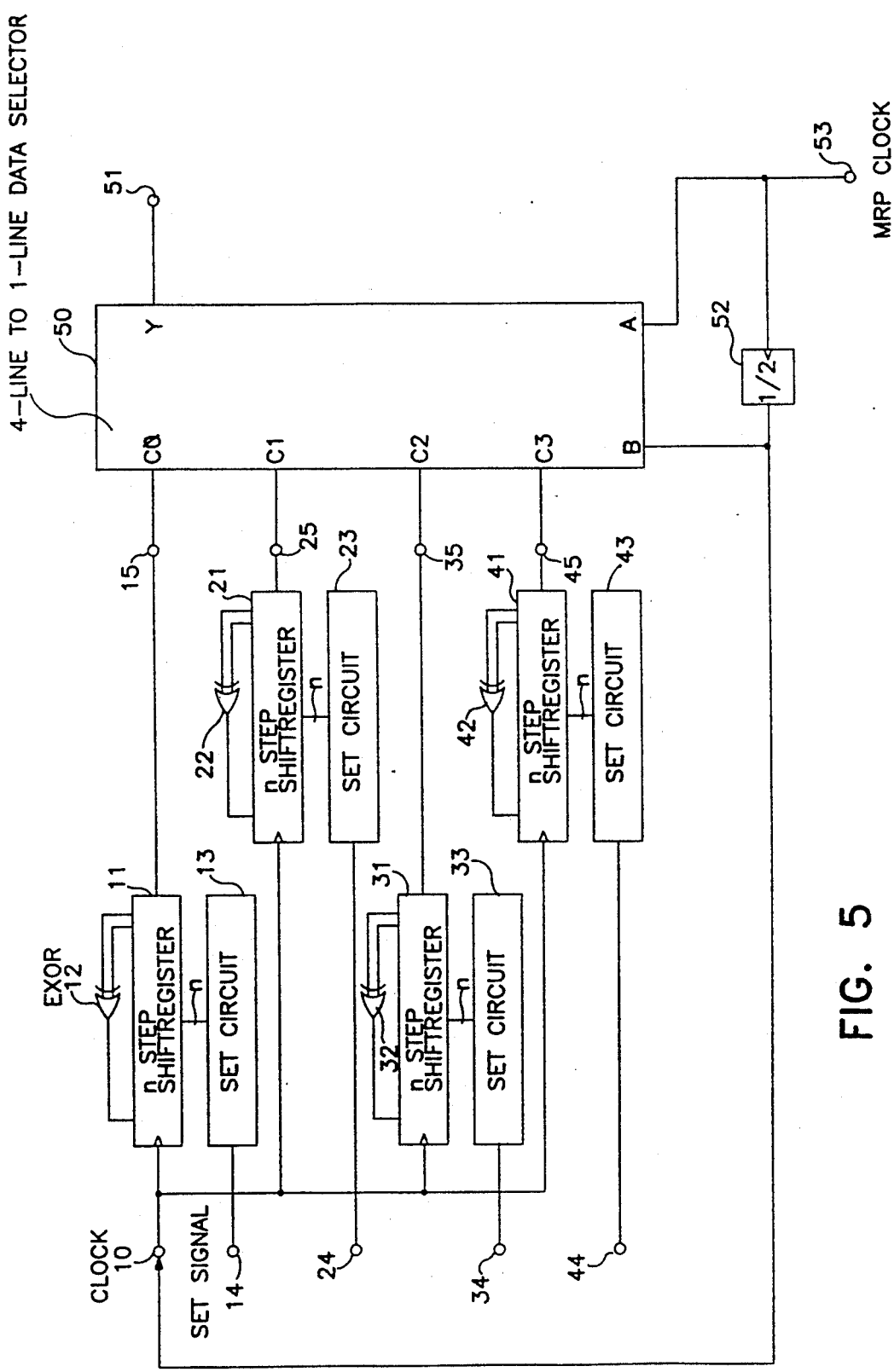
FIG. 5 shows a more detailed block diagram of the MRP generator according to the present invention.

FIG. 5 illustrates the connection of the clock 10 and the outputs of the circuit illustrated in FIG. 1. The output signals 15, 25, 35 and 45 from the four MRPs are led to a 4:1 selector 50 in which the output signals are four-fold multiplexed to give an output signal 51 by parallel-serial conversion. Further, a clock 53 is supplied to the selector 51. The clock is also supplied to a ½ frequency divider 52 in which the frequency is divided into half to form clock 10 to be supplied to the selector 50 as well as to the shift registers 11, 21, 31, and 41.

A clock signal is connected to the input side of the shift registers. The outputs of the shift registers are connected in parallel to the selector 50 to provide a multiplexed signal output. The selector 50 is a well-known multiplexer which one of ordinary skill in the art would know how to employ for such a purpose.

Figure 6:
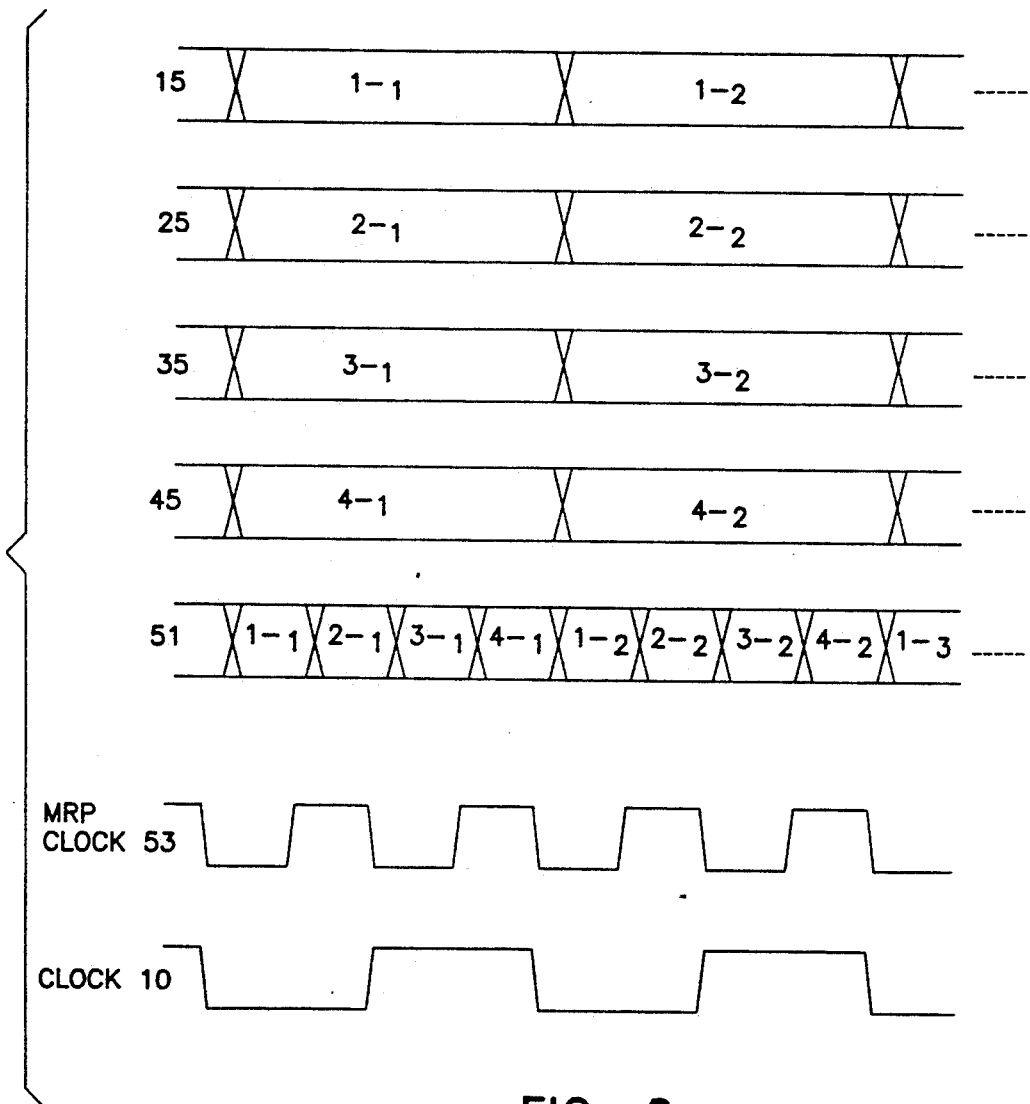
FIG. 6 shows a timing diagram of the FIG. 5 circuit.

FIG. 6 explains the operation of this circuit. During normal operation of the MRPs, the outputs 15, 25, 35, and 45 are random patterns. Observation of them by synchronizing them with the clock 10 gives eye patterns as shown in this figure. Respective data are shown by 1-1, 1-2, 2-1, 2-2, 3-1, 3-2, 4-1 and 4-2. As the select signals of the selector 50 are the MRP clock 53 and the clock 10, the output 51 is a multiplexed signal in which the MRP signals are speed-converted by four times. Thus, a high speed pattern in obtained by multiplexing the outputs of parallel MRPs.

Figure 7:
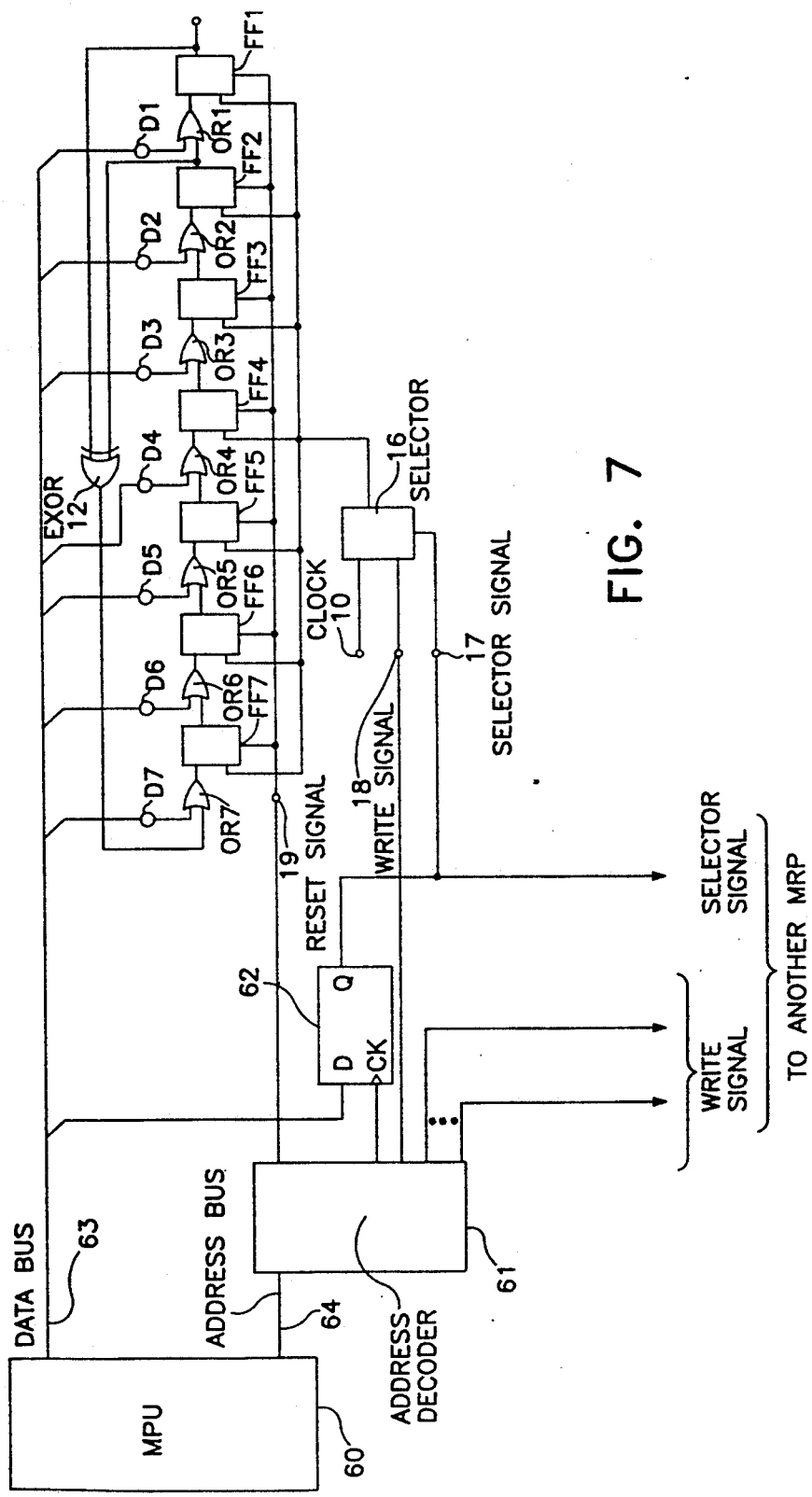
FIG. 7 shows a circuit for data setting of each of the MRPs.

FIG. 7 explains data setting of each of the MRPs. The setting data are supplied to microprocessor (MPU) 60 which is operated by programmed codes. The reset signal 19 and the write signal 18 are I/O signals formed by address decoder 61 which decodes the necessary portion 64 of the address bus of the MPU 60. Further, selector signal 17 is a part of the data latched by the I/O signals. The latch and data hold is effected by a D-FF 62. With this construction, the data setting to the FF1 through FF7 will be explained as follows.

(1) First, as the output of the selector 16, the write signal 18 is selected and the clock 10 is prevented from being supplied to the FFs 1-7. That is, the selector signal 17 is controlled by the D-selector 62. This is effected by selecting one line of the data bus 63 from the MPU 60 as data input, selecting one of the I/O addresses as clock input and I/O-writing from the MPU 60.

(2) Next, an address corresponding to the write signal 18 is generated, generating the reset signal 19 and resetting FF1-7 to make the level low, thereby rendering low one side of the inputs of the OR1-OR7.

(3) Necessary data D1-D7 are I/O written in the address corresponding to the write signal 18. At this moment, one side of the inputs of the OR1-OR7 are low. The data D1-D7 appears in the outputs of the OR1-OR7 and are led to the FF1-FF7 as inputs. Accordingly, FF1-FF7 store the necessary data.

(4) Finally, to select the clock 10 and the output of the selector 16, the output of the D-FF 62 is reversed in a similar manner to (1) above.

Thus, the initial data are set and the operation of the MRP is started with the clock 10.

Similar operation is effected in the other parallel MRPs in a manner similar to (2) and (3) above. From the foregoing, MRPs are capable of generating high speed patterns having a specific timing relation, and, thereby, a high speed pattern can be obtained by multiplexing.

Advantages of the present invention

According to the present invention, m MRP generating circuits are used in parallel and, assuming that the pattern cycle of each of the MRP generating circuits is 360 degrees, the time relation between the signals of the MRP generating circuits are set at $\Delta\theta=360/4$ and initial values of the generating circuits are sequentially distanced or shifted by this $\Delta\theta$ from one register to the next. From this arrangement, the following advantages are achieved.

(a) The degree of multiplexing is easily increased or decreased by changing the number of the MRP generating circuits as well as the initial values to be set in the MRP generating circuits.

(b) The MRP generating circuits in which the initial values can be set in the registers can be prepared as a unit and can be used for general purpose with respect to the multiplexing.

It should be noted that the present invention may be embodied in various forms without departing from the spirit of the present invention.

What we claim is:

1. A MRP (M-sequence random pattern) generator circuit which comprises m MRP pattern generating circuits, each comprising a shift register and an EXOR gate as a feedback loop of the shift register, the m MRP pattern generating circuits being connected in parallel at their outputs and the time relation between said outputs of the m MRP pattern generating circuits, on an assumption that the pattern cycle of each of the MRP generating circuits is 360 degrees, being set at $\Delta\theta=360/m$ and initial values for the m MRP pattern generating circuits being sequentially distanced by $\Delta\theta$ from one to the next, wherein each said shift register is connected to a set circuit for setting the initial value for each said shift register, each said register contains a plurality of flip-flops, said EXOR gate is connected to selected ones of the outputs of the flip-flops, said set circuit is connected to a selected one of the inputs of a plurality of OR gates connected to set inputs of said flip-flops and said flip-flops are connected to the other inputs of the OR gates, the OR gates being connected at their outputs to subsequent flip-flops.

2. A MRP generator according to claim 1 wherein a select circuit is provided to selectively enable the set circuit to input the initial values in the registers of the MRP generation circuits to generated the MRP.

* * * * *